US009780762B2

(12) United States Patent
Koto et al.

(10) Patent No.: US 9,780,762 B2
(45) Date of Patent: Oct. 3, 2017

(54) LEVEL CONVERTER CIRCUIT

(71) Applicant: SOCIONEXT INC., Yokohama-shi, Kanagawa (JP)

(72) Inventors: Tomohiko Koto, Kasugai (JP); Kenichi Konishi, Kasugal (JP); Osamu Uno, Kasugal (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/173,293

(22) Filed: Jun. 3, 2016

(65) Prior Publication Data

US 2017/0012612 A1    Jan. 12, 2017

(30) Foreign Application Priority Data

Jul. 6, 2015    (JP) .................................. 2015-135355

(51) Int. Cl.
*H03L 5/00* (2006.01)
*H03K 3/356* (2006.01)

(52) U.S. Cl.
CPC .............................. *H03K 3/356086* (2013.01)

(58) Field of Classification Search
CPC ..... H03K 19/018521; H03K 3/356113; H03K 19/00315; H03K 17/102; H03K 3/012
USPC .......................... 327/333; 326/63, 68, 80, 81
See application file for complete search history.

(56) References Cited

U.S. PATENT DOCUMENTS

| | | | | |
|---|---|---|---|---|
| 6,487,687 | B1* | 11/2002 | Blake | H03K 3/356113 324/762.07 |
| 6,664,809 | B1* | 12/2003 | Chiu | H03K 3/356113 326/68 |
| 2006/0208759 | A1 | 9/2006 | Nojiri | |
| 2006/0220682 | A1 | 10/2006 | Satou et al. | |
| 2011/0049621 | A1* | 3/2011 | Lotfi | H01L 21/82380 257/337 |
| 2012/0049924 | A1* | 3/2012 | Cheng | H03K 3/356165 327/333 |
| 2012/0075001 | A1 | 3/2012 | Sumitomo | |

FOREIGN PATENT DOCUMENTS

| | | |
|---|---|---|
| JP | H05-308274 A | 11/1993 |
| JP | 2006-261981 A | 9/2006 |
| JP | 2006-279517 A | 10/2006 |
| JP | 2010-041062 A | 2/2010 |
| JP | 2012-070333 A | 4/2012 |

* cited by examiner

*Primary Examiner* — Quan Tra
(74) *Attorney, Agent, or Firm* — Arent Fox LLP

(57) ABSTRACT

A level conversion circuit includes: first P-ch and N-ch transistors and second P-ch and N-ch transistors respectively connected in series between first and second power sources; third and fourth P-ch transistors respectively connected between the gates of the second and first P-ch transistors and the drain of the first and second P-ch transistors; and fifth and sixth P-ch transistors respectively connected between the gates of the second and first P-ch transistors and a third power source, wherein differential input signals are applied to the gates of the first and second N-ch transistors, a bias voltage is applied to the gates of the third and fourth P-ch transistors, the gate of the fifth and sixth P-ch transistors are respectively connected to connection nodes of the first P-ch and N-ch transistors the second P-ch and N-ch transistors.

4 Claims, 12 Drawing Sheets

FIG. 8

| STATE | | n1 | P7 |
|---|---|---|---|
| WHEN POWER SOURCE IS TURNED ON | VDE1 IS TURNED ON EARLIER AND VDE2 IS OFF | VDE1 | OFF |
| DURING NORMAL OPERATION | | L | ON |

FIG. 10

| STATE | | /MODE | n1 | P7 | N3 |
|---|---|---|---|---|---|
| WHEN POWER SOURCE IS TURNED ON | VDE1 IS TURNED ON EARLIER | * | VDE1 | OFF | OFF |
| DURING NORMAL OPERATION | LOW-VOLTAGE/HIGH-SPEED OPERATION (e.g., 1.8V) | 1 | H | OFF | ON |
| | HIGH-VOLTAGE INTERFACE OPERATION (e.g., 3.3V) | 0 | L | ON | OFF |

LEVEL CONVERTER CIRCUIT

CROSS-REFERENCE TO RELATED APPLICATION

This application is based upon and claims the benefit of priority of the prior Japanese Patent Application No. 2015-135355, filed on Jul. 6, 2015, the entire contents of which are incorporated herein by reference.

FIELD

The present invention relates to a level conversion circuit.

BACKGROUND

A voltage of signals transferred between semiconductor devices, namely, an interface (I/F) voltage has been decreased from the viewpoint of power consumption. For example, a voltage of signals input to or output from a semiconductor memory (e.g., DRAM) is lower than or equal to 1.8 V. Further, a data transfer rate exceeds 2 Gbps per signal pin. This means that elements forming input/output circuits are required to be low-voltage (low-withstand voltage) and have high operational speed. Accordingly, it is important for semiconductor devices to satisfy this request. On the other hand, in opposition to the decrease in the interface voltage, there is still a request in the market for using semiconductor devices of conventional interface voltage (e.g., 3.3 V). This request is generated from the preservation of compatibility with semiconductor devices of old interface standards.

In order to satisfy these two requests, there may be a method to prepare elements specialized in each request in the manufacturing process. However, the manufacturing process has become complicated in accordance with the miniaturization. Therefore, a very high manufacturing cost is needed to enable the above method.

As described above, a semiconductor device including only low-withstand voltage elements is requested to have a high-voltage I/F. This request can be realized by a level conversion circuit which includes only low-withstand voltage elements and is compatible with a high-voltage and high-speed operation. However, among the level conversion circuits having been proposed hitherto, there is none that simultaneously satisfy an increase in speed and the withstand voltage. Because of this, there has been a demand for a level converter to have both high speed and low withstand voltage.

Further, in the interface equipment with various SD cards, there is a case where the voltage of the interface is changed between the data read operation and the data write (storage) operation. In such a case, it is desirable to be able to deal with the case by changing only the power source voltage to be supplied without changing the circuit.

RELATED DOCUMENTS

[Patent Document 1] Japanese Laid Open Patent Publication No. 2006-261981
[Patent Document 2] Japanese Laid Open Patent Publication No. 2006-279517
[Patent Document 3] Japanese Laid Open Patent Publication No. 2010-41062
[Patent Document 4] Japanese Laid Open Patent Publication No. H05-308274
[Patent Document 5] Japanese Laid Open Patent Publication No. 2012-70333

SUMMARY

According to an aspect of the invention, a level conversion circuit includes: a first P-ch transistor and a first N-ch transistor connected in series between a first power source and a second power source whose voltage is lower than the voltage of the first power source; a second P-ch transistor and a second N-ch transistor connected in series between the first power source and the second power source; a third P-ch transistor connected between the gate of the second P-ch transistor and the drain of the first P-ch transistor; a fourth P-ch transistor connected between the gate of the first P-ch transistor and the drain of the second P-ch transistor; a fifth P-ch transistor connected between the gate of the second P-ch transistor and a third power source; and a sixth P-ch transistor connected between the gate of the first P-ch transistor and the third power source, wherein differential input signals are applied to the gates of the first N-ch transistor and the second N-ch transistor, a bias voltage is applied to the gates of the third P-ch transistor and the fourth P-ch transistor, the gate of the fifth P-ch transistor is connected to a connection node of the first P-ch transistor and the first N-ch transistor, and the gate of the sixth P-ch transistor is connected to a connection node of the second P-ch transistor and the second N-ch transistor.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF DRAWINGS

FIG. 8 is a diagram illustrating the output n1 of the VDE2 turning-on detection circuit and the operation state of a P-ch transistor P7 when the power source is turned on and during the normal operation;

FIG. 10 is a diagram illustrating the output n1 of the control circuit (S1) and the operation state of P7 when the power source is turned on and during the normal operation;

DESCRIPTION OF EMBODIMENTS

Figure 1:
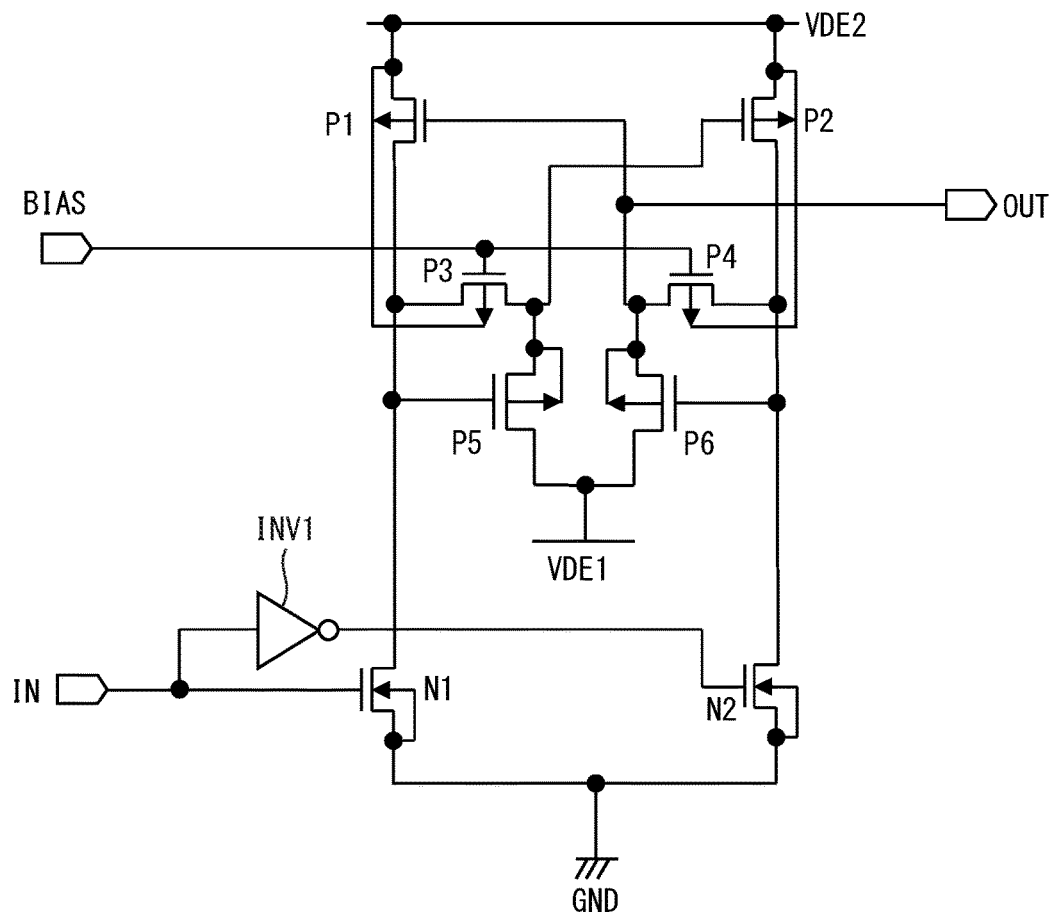
FIG. 1 is a circuit diagram of a level conversion circuit of a first embodiment.

FIG. 1 is a circuit diagram of a level conversion circuit of a first embodiment.

The level conversion circuit of the first embodiment has a first P-channel (ch) transistor P1, a second P-ch transistor P2, a first N-channel (ch) transistor N1, a second N-ch transistor N2, and an inverter INV1. The level conversion circuit further has a third P-ch transistor P3, a fourth P-ch transistor P4, a fifth P-ch transistor P5, and a sixth P-ch transistor P6.

P1 and N1 are connected in series between a high (potential) power source (terminal) VDE2 and a low (potential) power source (terminal) GND, P2 and N2 are connected in series between VED2 and GND, and the column of P1 and N1 and the column of P2 and N2 form a differential pair. P3 is connected between the connection node of P1 and N1, and the gate of P2, P4 is connected between the connection node of P2 and N2, and the gate of P1, and a bias voltage BIAS is applied to the gates of P3 and P4. P5 is connected between the gate of P2 and a third power source VDE1 and the gate of P5 is connected to the connection node of P1 and N1. P6 is connected between the gate of P1 and VDE1 and the gate of P6 is connected to the connection node of P2 and N2. To the gate of N1, an input signal IN is applied and to the gate of N2, a signal obtained by inverting the input signal IN by INV1 is applied. An output OUT is obtained from the gate of P1. The channels (back gates) of P1, P2, N1, N2, P5, and P6 are connected to the sources. The channels (back gates) of P3 and P4 are connected to VDE2. In the following explanation, there is a case where the voltage of the output OUT is denoted as OUT.

VDE1, VDE2, and GND are in a relationship of GND<VDE1<VDE2 and here, GND=0 V and VDE1≈VDE2/2. The potential of VDE1 is such that the potential difference VDE2−VDE1 and the potential difference VDE1−GND do not exceed the gate withstand voltages (between gate and source (Vgs) and between gate and back gate (Vgb)) of P1, P2, P3, P4, P5, P6, N1, and N2. BIAS is at a level sufficiently higher than GND and sufficiently lower than VDE1−Vth (P-ch).

Figure 2:
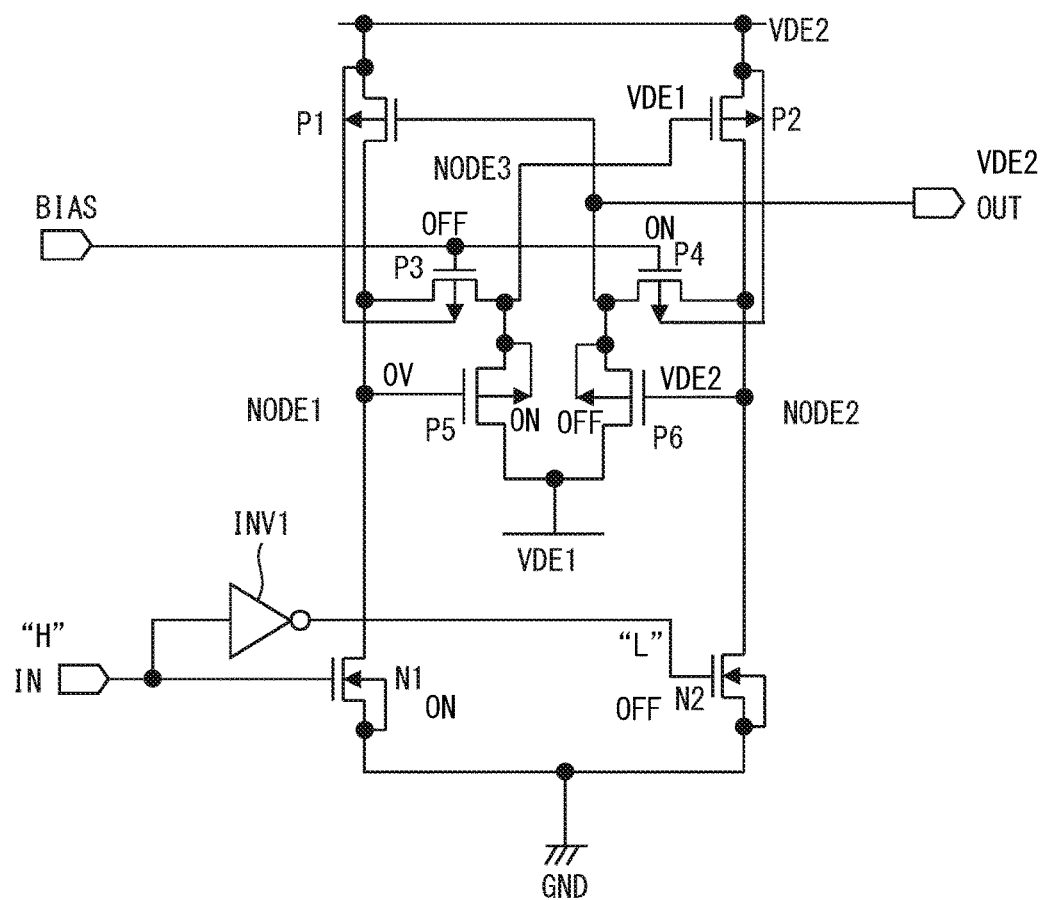
FIG. 2 is a diagram explaining the operation of the level conversion circuit of the first embodiment.

FIG. 2 is a diagram explaining the operation of the level conversion circuit of the first embodiment.

Figure 3:
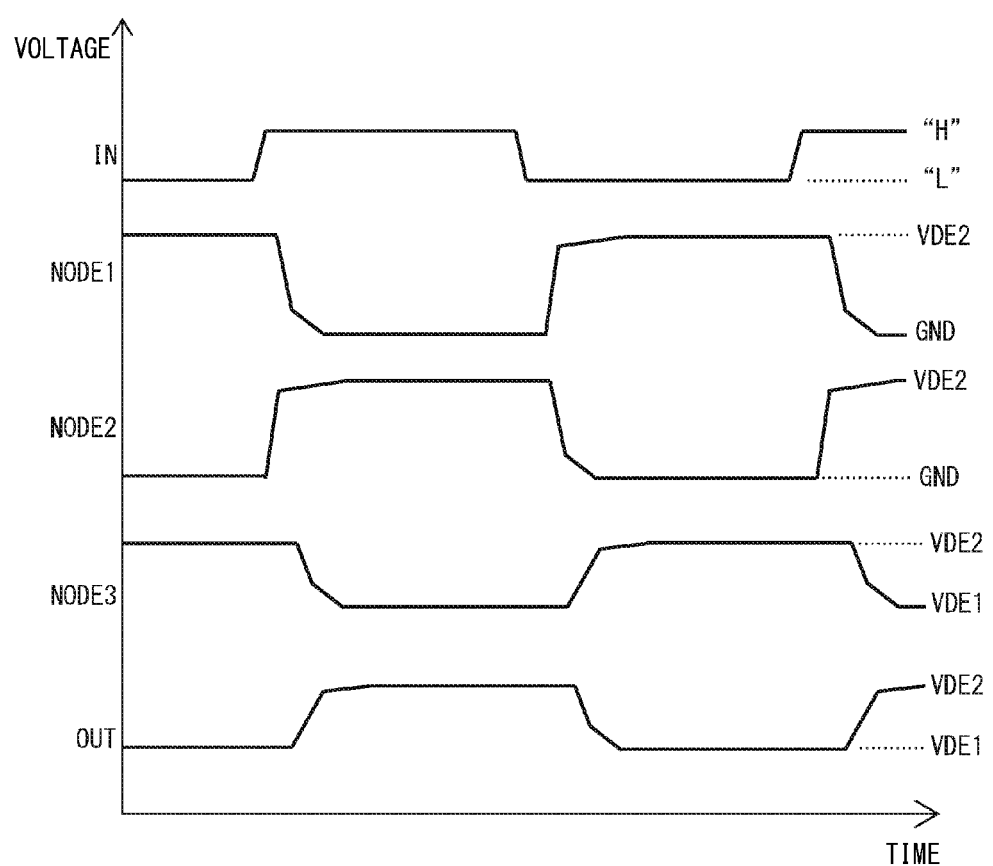
FIG. 3 is a time chart illustrating the voltage waveform of each part of the level conversion circuit of the first embodiment.

FIG. 3 is a time chart illustrating the voltage waveform of each part of the level conversion circuit of the first embodiment.

FIG. 2 illustrates a state of each part when IN is at an H level. With reference to FIG. 2 and FIG. 3, the operation when IN is at the H level is explained.

When IN is at the H level, N1 turns on (ON) and N2 turns off (OFF). Due to this, a connection node (NODE1) of P1 and N1 becomes close to GND (0 V) and a connection node (NODE2) of P2 and N2 becomes close to VDE2, respectively. Because the gate voltage (BIAS) of P3 is in a state higher than the source (NODE1), P3 turns off and because the gate voltage (BIAS) of P4 is in a state lower than the source (NODE2), P4 turns on. Due to this, the potential of the gate (OUT) of P1 becomes close to VDE2. Further, the gate of P5 is at the low level and P5 turns on, and therefore, a gate (NODES) of P2 becomes VDE1, and P2 turns on, and therefore, NODE2 becomes VDE2 and because P4 is on, OUT becomes VDE2. At this time, the gate of P6 is at the high level and P6 turns off, and therefore, it is unlikely that OUT that outputs VDE2 and VDE1 are brought into conduction. There will arise no problem provided that BIAS is at a level sufficiently lower than a level of VDE2−Vth (P4) at which P4 can turn on.

The potential at each part is as described above, and therefore, it is unlikely that a voltage exceeding the gate withstand voltage is applied to each transistor. When IN is at the L level, the state is such that P1 is exchanged with P2, N1 is exchanged with N2, P3 is exchanged with P4, and P5 is exchanged with P6 in FIG. 2, and therefore, VDE1 is output from OUT.

As illustrated in FIG. 3, in the level conversion circuit of the first embodiment, when IN changes between the high level ("H" (VDE1)) and the low level ("L" (GND)), OUT changes between VDE1 and VDE2 and the signal level is converted. In the level conversion circuit of the first embodiment, it is unlikely that the output OUT falls below VDE1.

Figure 4:
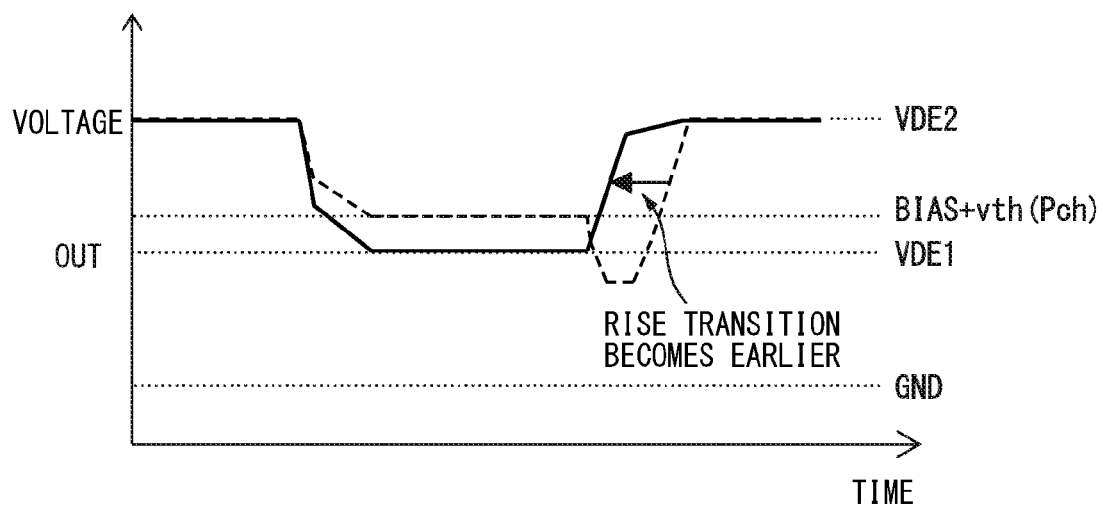
FIG. 4 is a time chart illustrating the change in an output OUT in detail when an input IN changes from the H level to the L level and from the L level to the H level in the level conversion circuit of the first embodiment.

FIG. 4 is a time chart illustrating the change in OUT in detail when IN changes from the H level to the L level and from the L level to the H level in the level conversion circuit of the first embodiment. In FIG. 4, the solid line indicates the change in the first embodiment and the dotted line indicates the change in the case where neither P5 nor P6 is provided.

In the case where neither P5 nor P6 is provided, the L level of OUT becomes BIAS+Vth (Pch), but in the first embodiment, both P5 and P6 turn on, and therefore, the L level of OUT becomes the stable VDE1 potential that is supplied. Further, by providing P5 and P6, as compared to the case where neither P5 nor P6 is provided, the rise transition of OUT becomes earlier when IN changes from the L level to the H level.

In the first embodiment, it is not necessary for the potential to be the same as BIAS and VDE1, but by making the potential of BIAS and VDE1 the same, the following effects are obtained.

(1) The third power source circuit that generates the BIAS level is no longer necessary, and therefore, the circuit area can be reduced by that amount.

(2) It is possible to reduce the standby current for the BIAS level generation circuit.

(3) The BIAS level itself no longer exists, and therefore, it is no longer necessary to take into consideration the fluctuations in the characteristics due to the fluctuations in the BIAS level and the capacitor for stabilizing the BIAS level is no longer necessary.

The level conversion circuit of the first embodiment is capable of a high-speed operation while maintaining the withstand voltage only with the elements designed for a low-voltage (low-withstand voltage)/high-speed operation, and the level conversion circuit can be downsized. However, there are the following problems.

Figure 5:
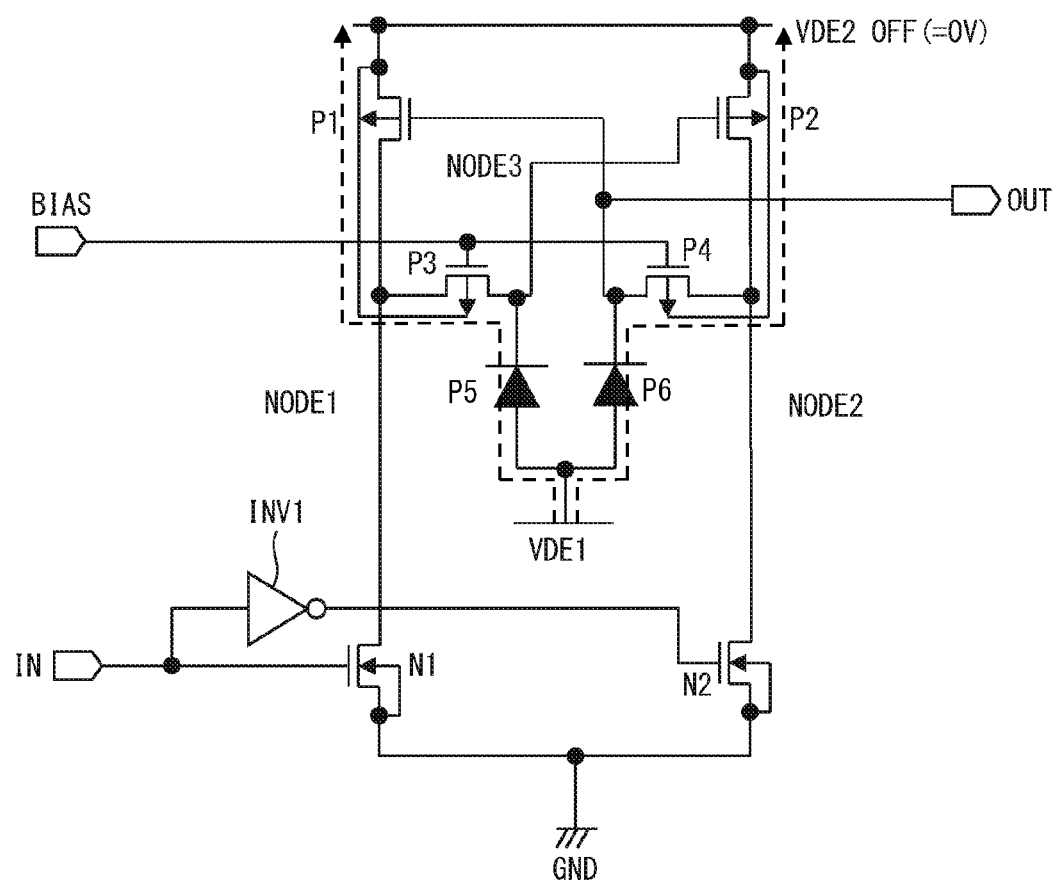
FIG. 5 is a diagram explaining a first problem of the first embodiment.

FIG. 5 is a diagram explaining a first problem of the first embodiment.

The first problem is a problem that arises in the case where VDE2 is off (0 V) and VDE1 is turned on earlier, in which the drain-back gate of P5 and P6 becomes a diode (forward) and an unwanted current flows from VDE1 to VDE2 as shown in FIG. 5. Specifically, as indicated by the broken line in FIG. 5, an unwanted current flows in a path from VDE1 to VDE2 via P5, P3, and P1 and in a path from VDE1 to VDE2 via P6, P4, and P2. This problem does not arise in the case where VDE1 and VDE2 rise simultaneously with respect to GND, but in general, in the power source circuit, after generating VDE1, VDE2 is generated from VDE1, and therefore, VDE1 is turned on earlier and this problem arises.

Figure 6:
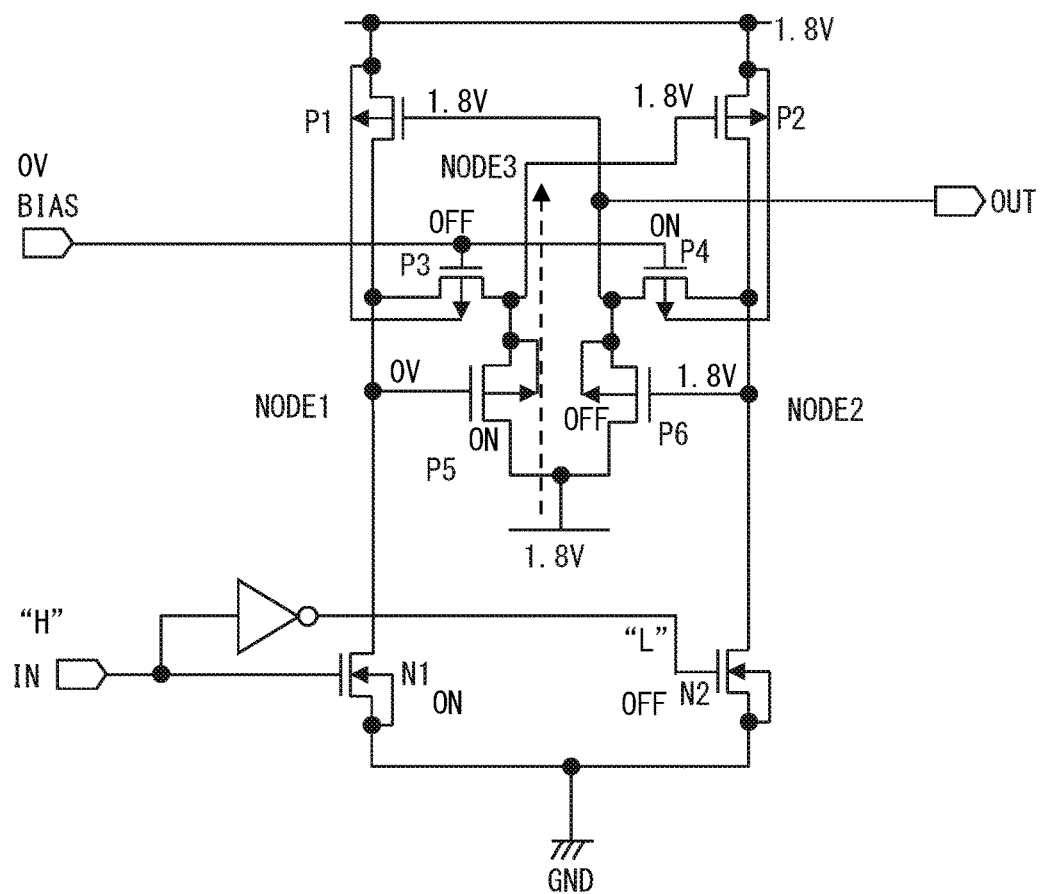
FIG. 6 is a diagram explaining a second problem of the first embodiment.

FIG. 6 is a diagram explaining a second problem of the first embodiment.

The level converter of the first embodiment operates when VDE1<VDE2, but it is desirable that the level converter can also perform a low-voltage (low-withstand voltage)/high-speed operation even in the case where the level converter operates in the state where VDE1=VDE2. The second problem is that the level conversion circuit of the first embodiment does not perform a low-voltage (low-withstand voltage)/high-speed operation when the voltage (1.8 V) that is the voltage of VDE1 is also supplied to VDE2. As illustrated in FIG. 6, in the case where the VDE1=VDE2=1.8 V (GND=0 V) and IN="H", P5 turns on and 1.8 V is supplied to NODES. Because of this, the gate potentials of both P1 and P2 become close to 1.8 V, and therefore, P1 and P2 turn off, and the operation is not performed any more.

A level conversion circuit of a second embodiment that is explained next will solve the first problem of the level conversion circuit of the first embodiment illustrated in FIG. 5.

Figure 7A:
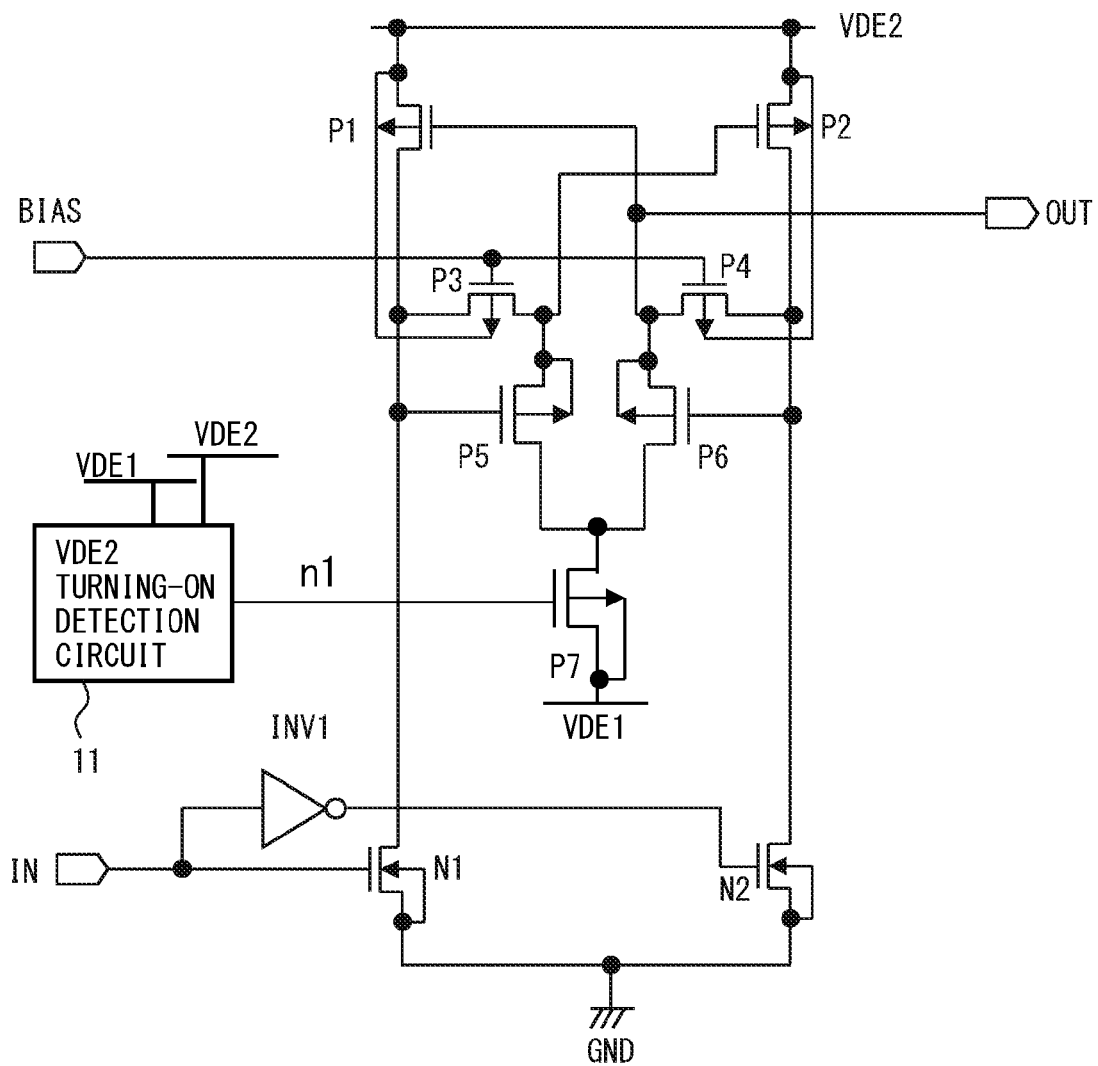
FIG. 7A is a circuit diagram of the entire level conversion circuit of the second embodiment.
Figure 7B:
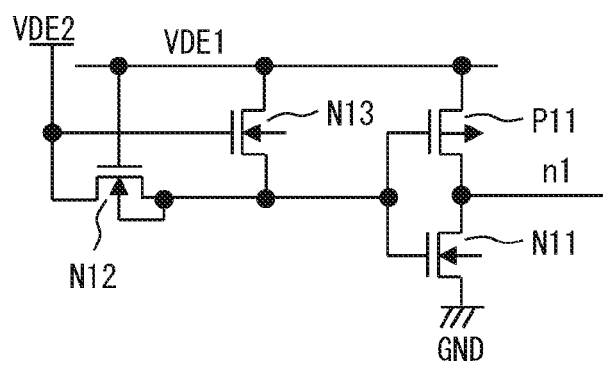
FIG. 7B is a circuit diagram of a VDE2 turning-on detection circuit that is provided within the level conversion circuit of the second embodiment.

FIG. 7A and FIG. 7B are circuit diagrams of the level conversion circuit of the second embodiment, and FIG. 7A illustrates the entire level conversion circuit and FIG. 7B illustrates a circuit diagram of a VDE2 turning-on detection circuit that is provided within the level conversion circuit.

The second embodiment differs from the first embodiment in that a P-ch transistor P7 is connected between the drains of P5 and P6, and VDE1, and a VDE2 turning-on detection circuit 11 that generates a signal n1 to be applied to the gate of P7 is provided and the other portions are the same as those of the first embodiment. P7 turns off when the output n1 of the VDE2 turning-on detection circuit 11 is VDE1 and turns on when the output n1 is at the L level. The VDE2 turning-on detection circuit 11 changes the output n1 in accordance with the relationship between VDE1 and VDE2.

FIG. 8 is a diagram illustrating the output n1 of the VDE2 turning-on detection circuit 11 and the operation state of P7 when the power source is turned on and during the normal operation.

In the VDE2 turning-on detection circuit 11, in the state where VDE1 is turned on earlier and VDE2 is off when the power source is turned on, i.e., when VDE2<VDE1, N12 turns on and N13 turns off, and therefore, the gates of P11 and N11 become the L level. Due to this, P11 turns on, N11 turns off, n1 becomes VDE1, and P7 turns off.

During the normal operation, because VDE1<VDE2, N12 turns off and N13 turns on, and therefore, the gates of P11 and N11 become VDE1. Due to this, P11 turns off, N11 turns on, n1 becomes the L level, and P7 turns on.

In the state where VDE2<VDE1 when the power source is turned on, P7 is off and the current path from VDE1 to VDE2 illustrated in FIG. 5 is not formed, and therefore, the first problem described previously does not arise. During the normal operation, P7 is on and the circuit configuration is substantially the same as that of the first embodiment in FIG. 1, and therefore, the same effects as those of the first embodiment are obtained.

A level conversion circuit of a third embodiment that is explained next will solve the second problem of the level conversion circuit of the first embodiment illustrated in FIG. 6.

Figure 9A:
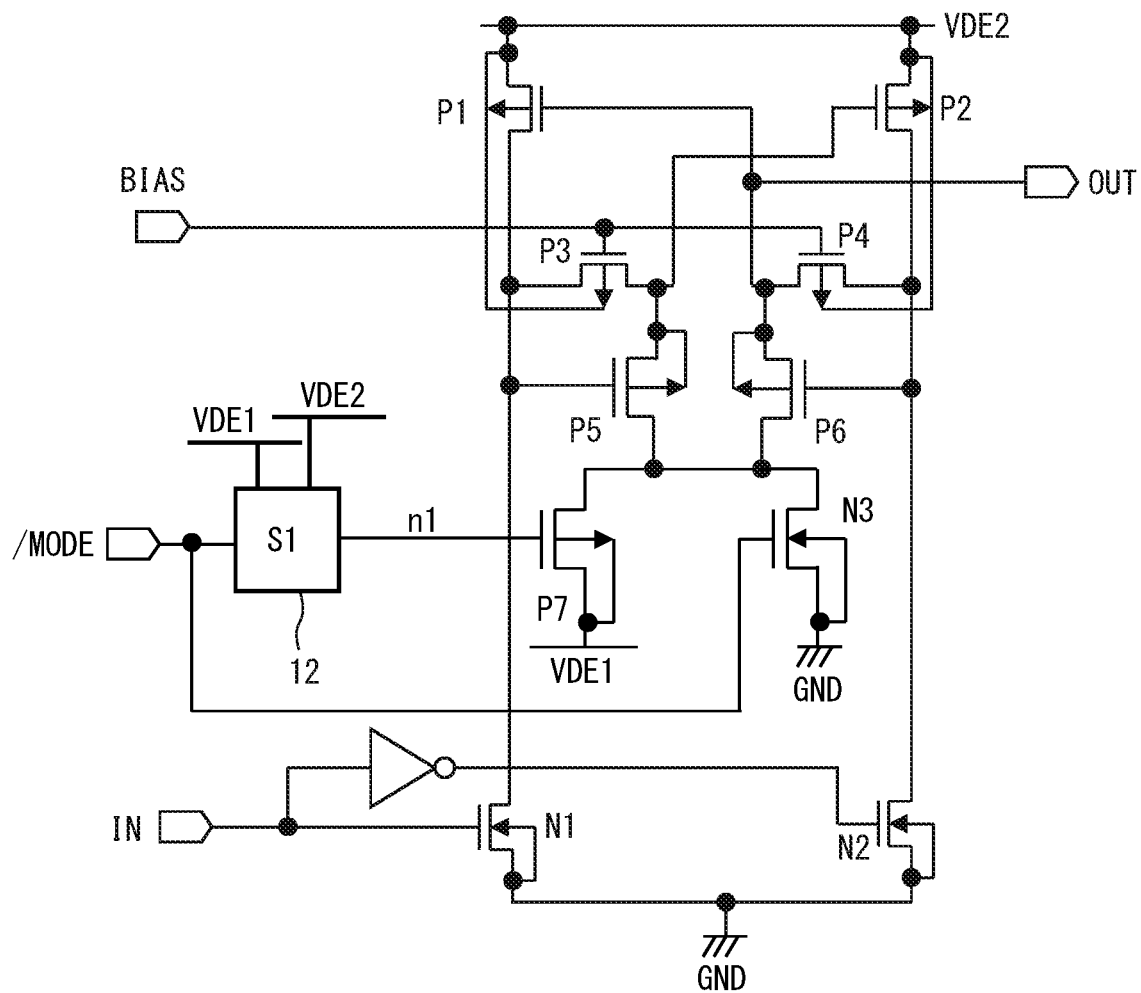
FIG. 9A is a circuit diagram of the entire level conversion circuit of the third embodiment.
Figure 9B:
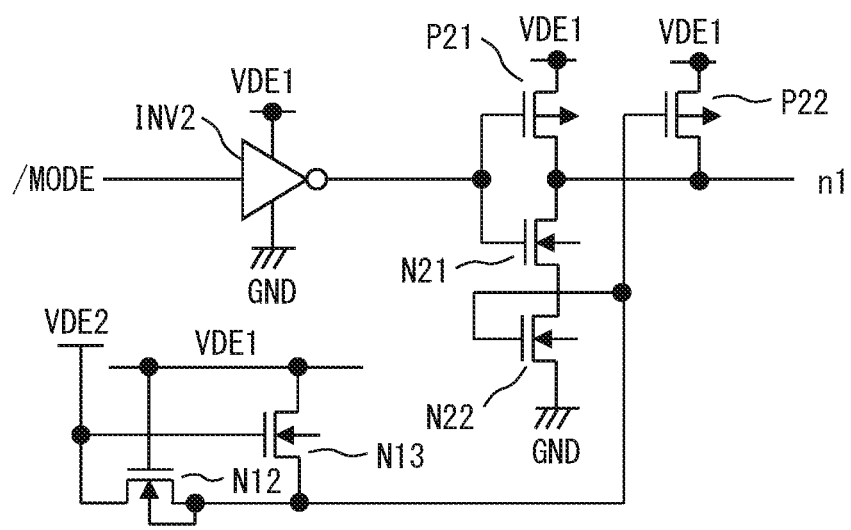
FIG. 9B is a circuit diagram of a control circuit (S1) that is provided within the level conversion circuit of the third embodiment.

FIG. 9A and FIG. 9B are circuit diagrams of the level conversion circuit of the third embodiment, and FIG. 9A illustrates the entire level conversion circuit and FIG. 9B illustrates a circuit diagram of a control circuit (S1) that is provided within the level conversion circuit.

It is possible for the level conversion circuit of the third embodiment to select one of the state of performing a low-voltage/high-speed operation (e.g., 1.8 V) and the state of performing a high-voltage interface operation (e.g., 3.3 V). During the low-voltage/high-speed operation, VDE1=VDE2=1.8 is supplied and a mode signal /MODE=1 (H level) is input from the outside. During the high-voltage interface operation, VDE1=1.8 V and VDE2=3.3 V are supplied and /MODE=0 (L level) is input from the outside.

The third embodiment differs from the second embodiment in that an N-ch transistor N3 is connected between the drains of P5 and P6, and GND, and a control circuit (S1) 12 is provided in place of the VDE2 turning-on detection circuit 11 that generates the signal n1 to be applied to the gate of P7. The control circuit 12 changes the output n1 in accordance with the mode signal /MODE and the relationship between VDE1 and VDE2. P7 turns off in the case where VDE2<VDE1 when the power source is turned on, and during the normal operation, P7 turns off when /MODE=1 (H level) and turns on when /MODE=0 (L level). To the gate of N3, /MODE is applied. N3 turns on when /MODE=1 (H level) and turns off when /MODE=0 (L level). The other portions of the third embodiment are the same as those of the second embodiment.

FIG. 10 is a diagram illustrating the output n1 of the control circuit (S1) and the operation state of P7 when the power source is turned on and during the normal operation.

In the control circuit 12, in the state where VDE1 is turned on earlier and VDE2 is off when the power source is turned on, i.e., when VDE2<VDE1, N12 turns on and N13 turns off, and therefore, the gates of P22 and N22 become the L level. Due to this, regardless of /MODE, P22 turns on, N22 turns off, n1 becomes VDE1, and P7 turns off. When the power source is turned on, /MODE=0 (L level), and therefore, N3 turns off. There will arise no problem even if N3 turns on with /MODE=1 (H level) when the power source is turned on.

The normal operation is divided into the case of the low-voltage/high-speed operation with VDE1=VDE2 and /MODE=1 (H level) and the case of the high-voltage interface operation with the VDE1<VDE2 and /MODE=0 (L level).

In the case where VDE1=VDE2 and /MODE=1 (H level), N12 and N13 turn on, and therefore, the gates of P22 and N22 become the H level (VDE1), and P22 turns off and N22 turns on. On the other hand, because /MODE=1, the gates of P21 and N21 become the L level, and P21 turns on and N21 turns off. P21, N21, and N22 are stacked vertically in three stages, and therefore, even if P21 turns on and N22 turns on, a through current does not flow because N21 is off. Because P21 is on, n1 becomes the H level (VDE1), and P7 turns off and N3 turns on. Due to this, P5 and P6 are connected between the gates of P1 and P2, and GND, and when P5 or P6 turns on, GND is applied to the gate of P1 or P2, and therefore, the low-voltage (1.8 V)/high-speed operation is possible.

In the case where VDE1<VDE2 and /MODE=0 (L level), N12 turns off and N13 turns on, and therefore, the gates of P22 and N22 become the H level (VDE1), and P22 turns off and N22 turns on. On the other hand, because /MODE=0, the gates of P21 and N21 become the H level, and P21 turns off and N21 turns on. Because N21 and N22 are on, n1 becomes the L level (GND), and P7 turns on and N3 turns off. Due to this, the configuration becomes substantially the same as that of the first embodiment, and therefore, the high-voltage interface operation (3.3 V) is possible.

Figure 11:
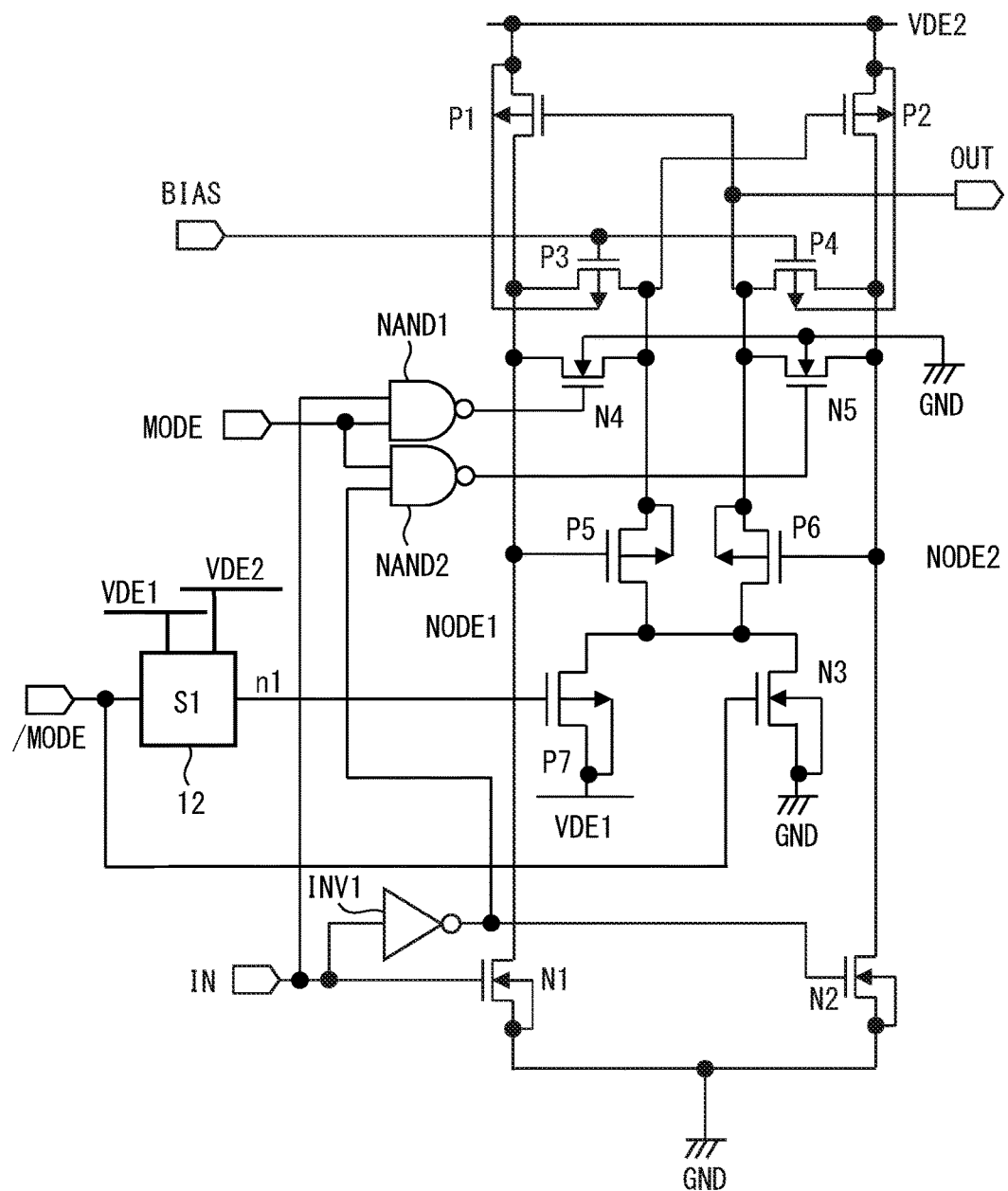
FIG. 11 is a circuit diagram of a level conversion circuit of a fourth embodiment.

FIG. 11 is a circuit diagram of a level conversion circuit of a fourth embodiment.

The fourth embodiment differs from the third embodiment in that N-ch transistors N4 and N5 are connected in parallel to P3 and P4, and MODE and NAND1 and NAND2 that generate signals that are applied to the gates of N4 and N5, respectively, from IN are provided. To NAND1, MODE and IN are input and to NAND2, MODE and an output (/IN) of INV1 are input.

During the low-voltage/high-speed operation (MODE=0, /MODE=1), the outputs of NAND1 and NAND2 are fixed to the H level, and therefore, N4 and N5 are on at all times. Consequently, a state is brought about where the gate of P1 is connected to NODE2 and the gate of P2 is connected to NODE1, and therefore, it is possible to stabilize the output OUT and to increase the speed of the output OUT. On the other hand, during the high-voltage interface operation (MODE=1, /MODE=0), the output of NAND1 changes in synchronization with /IN, N4 turns on in synchronization with /IN, the output of NAND2 changes in synchronization with IN, and N5 turns on in synchronization with IN.

Figure 12A:
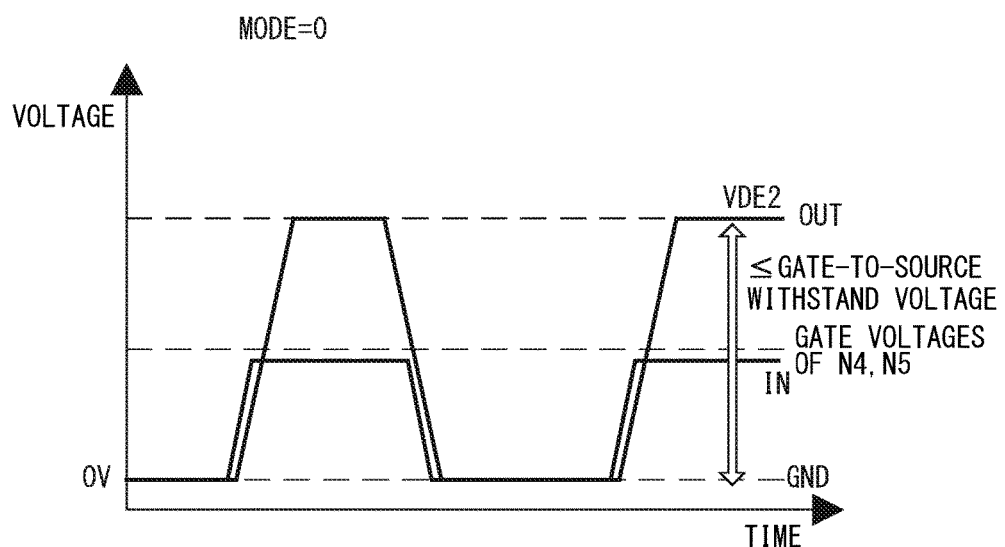
FIG. 12A is a time chart illustrating the operation of each unit in the fourth embodiment during the low-voltage/high-speed operation (MODE=0, /MODE=1)
Figure 12B:
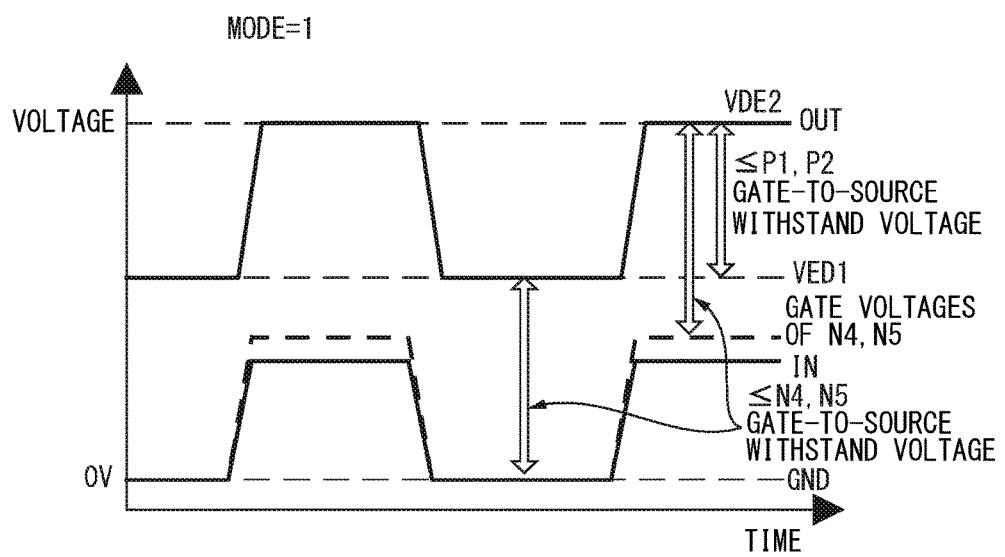
FIG. 12B is a time chart illustrating the operation of each unit in the fourth embodiment during the high-voltage interface operation (MODE=1, /MODE=0).

FIG. 12A and FIG. 12B are time charts each illustrating the operation of each unit in the fourth embodiment, and FIG. 12A illustrates the operation during the low-voltage/high-speed operation (MODE=0, /MODE=1) and FIG. 12B illustrates the operation during the high-voltage interface operation (MODE=1, /MODE=0).

When MODE=0, the gate voltages of N4 and N5 are fixed to the H level and the function to suppress the gate-to-source voltages of P1 and P2 by P3 and P4 is no longer effective. Due to this, as illustrated in FIG. 12A, an output amplitude of VDE2−GND is obtained from OUT. This brings about an advantage in the viewpoint of the high-speed operation of the circuit in the subsequent stages. FIG. 12A illustrates the case where the gate voltages (VDE1) of N4 and N5 are lower than VDE2, but if VDE1=VDE2, the amplitude of IN and that of OUT become the same.

On the other hand, when MODE=1, VDE1≈VDE2/2, and therefore, it is necessary to make effective the function to suppress the gate-to-source voltages of P1 and P2, and it is also necessary to perfectly turn off N4 and N5 and at the same time, to reduce the gate-to-source voltages of N4 and N5 to the withstand voltage or lower. This cannot be implemented simply by reducing the gate voltages of N4 and N5 to 0 V. Because of this, as illustrated in FIG. 11 and FIG. 12B, when MODE=1, by supplying a signal in the same phase as that of IN to the gate of N5 and a signal (/IN) in the phase opposite to that of IN to the gate of N4, it is made possible to change the gate voltage in accordance with each source voltage in N4 and N5. Due to this, it is made possible to reduce the gate-to-source voltages of N4 and N5 to the withstand voltage or lower.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A level conversion circuit comprising:
   a first P-ch transistor and a first N-ch transistor connected in series between a first power source and a second power source whose voltage is lower than the voltage of the first power source;
   a second P-ch transistor and a second N-ch transistor connected in series between the first power source and the second power source;
   a third P-ch transistor connected between the gate of the second P-ch transistor and the drain of the first P-ch transistor;
   a fourth P-ch transistor connected between the gate of the first P-ch transistor and the drain of the second P-ch transistor;
   a fifth P-ch transistor connected between the gate of the second P-ch transistor and a third power source; and
   a sixth P-ch transistor connected between the gate of the first P-ch transistor and the third power source, wherein
   differential input signals are applied to the gates of the first N-ch transistor and the second N-ch transistor,
   a bias voltage is applied to the gates of the third P-ch transistor and the fourth P-ch transistor,
   the gate of the fifth P-ch transistor is connected to a connection node of the first P-ch transistor and the first N-ch transistor, and
   the gate of the sixth P-ch transistor is connected to a connection node of the second P-ch transistor and the second N-ch transistor.

2. The level conversion circuit according to claim 1, comprising:
   a seventh P-ch transistor connected between the fifth P-ch transistor and the sixth P-ch transistor, and the third power source; and
   a power source turning-on detection circuit that outputs the voltage of the third power source when the voltage of the first power source is lower than the voltage of the third power source, and outputs the voltage of the first power source when the voltage of the first power source is higher than the voltage of the third power source, wherein
   the output of the power source turning-on detection circuit is applied to the gate of the seventh P-ch transistor, and
   the seventh P-ch transistor turns off when the voltage of the first power source is lower than the voltage of the third power source, and the seventh P-ch transistor turns on when the voltage of the first power source is higher than the voltage of the third power source.

3. The level conversion circuit according to claim 1, comprising:
   a seventh P-ch transistor connected between the fifth P-ch transistor and the sixth P-ch transistor, and the third power source;
   a third N-ch transistor connected between the fifth P-ch transistor and the sixth P-ch transistor, and the second power source; and
   a power source turning-on detection circuit that receives a mode signal, which becomes a high level when an operation is performed in a state where the voltage of the first power source is equal to the voltage of the third power source and becomes a low level when an operation is performed in a state where the voltage of the first power source is higher than the voltage of the third power source, outputs the voltage of the third power source when the voltage of the first power source is lower than the voltage of the third power source regardless of the mode signal, outputs a high level when an operation is performed in a state where the mode signal is at a high level and the voltage of the first power source is equal to the voltage of the third power source, and outputs a low level when an operation is performed in a state where the signal mode is at a low level and the voltage of the first power source is higher than the voltage of the third power source, wherein the output of the power source turning-on detection circuit is applied to the gate of the seventh P-ch transistor, the mode signal is applied to the gate of the third N-ch transistor, and when the voltage of the first power source is lower than the voltage of the third power source, the seventh P-ch transistor turns off, when the mode signal is at a high level and the voltage of the first power source is equal to the voltage of the third power source, the seventh P-ch transistor turns off and the third N-ch transistor turns on, and when the mode signal is at a low level and the voltage of the first power source is higher than the voltage of the third power source, the seventh P-ch transistor turns on and the third N-ch transistor turns off.

4. The level conversion circuit according to claim 3, comprising:

a fourth N-ch transistor that is connected in parallel to the third P-ch transistor, turns on when the mode signal is at a low level, and turns on/off in synchronization with one of the differential input signals when the mode signal is at a high level; and a fifth N-ch transistor that is connected in parallel to the fourth P-ch transistor, turns on when the mode signal is at a low level, and turns on/off in synchronization with the other of the differential input signals when the mode signal is at a high level.

* * * * *